(12) United States Patent
Leung et al.

(10) Patent No.: US 8,742,406 B1
(45) Date of Patent: Jun. 3, 2014

(54) SOFT LITHOGRAPHY MICROLENS FABRICATION AND ARRAY FOR ENHANCED LIGHT EXTRACTION FROM ORGANIC LIGHT EMITTING DIODES (OLEDS)

(75) Inventors: Wai Y. Leung, Ames, IA (US); Joong-Mok Park, Ames, IA (US); Zhengqing Gan, Pleasant Hill, CA (US); Kristen P. Constant, Ames, IA (US); Joseph Shinar, Ames, IA (US); Ruth Shinar, Ames, IA (US); Kai-Ming Ho, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 93 days.

(21) Appl. No.: 13/397,749

(22) Filed: Feb. 16, 2012

Related U.S. Application Data

(60) Provisional application No. 61/443,465, filed on Feb. 16, 2011.

(51) Int. Cl.
*H01L 51/54* (2006.01)
(52) U.S. Cl.
USPC .......................................................... 257/40
(58) Field of Classification Search
USPC .......................................................... 257/40
See application file for complete search history.

(56) References Cited

U.S. PATENT DOCUMENTS

| | | | |
|---|---|---|---|
| 1,359,789 A | 11/1920 | Brown | |
| 2,859,369 A | 11/1958 | Williams et al. | |
| 5,136,678 A | 8/1992 | Yoshimura | |
| 5,365,541 A | 11/1994 | Bullock | |
| 6,027,595 A | 2/2000 | Suleski | |
| 6,268,685 B1 | 7/2001 | Stark et al. | |
| 6,274,293 B1 | 8/2001 | Gupta et al. | |
| 6,355,198 B1 | 3/2002 | Kim et al. | |
| 6,538,087 B2 | 3/2003 | Zhao et al. | |
| 6,552,760 B1 | 4/2003 | Gotoh et al. | |
| 6,555,406 B1 | 4/2003 | Leung et al. | |

(Continued)

FOREIGN PATENT DOCUMENTS

| | | | |
|---|---|---|---|
| WO | WO 2005/052987 A1 | 6/2005 | |
| WO | WO 2007/035902 A1 | 3/2007 | |

OTHER PUBLICATIONS

Mikrajuddin et al; Single Route for Producing Organized Metallic Domes, Dots, and Pores by Colloidal Templating and Over-Sputtering; Paper; Jun. 18, 2002; pp. 930-933; Adv Mater. 2002,14, No. 12; Advanced Materials.

(Continued)

*Primary Examiner* — Thao P Le
(74) *Attorney, Agent, or Firm* — Reinhart Boerner Van Deuren P.C.

(57) ABSTRACT

Provided are microlens arrays for use on the substrate of OLEDs to extract more light that is trapped in waveguided modes inside the devices and methods of manufacturing same. Light extraction with microlens arrays is not limited to the light emitting area, but is also efficient in extracting light from the whole microlens patterned area where waveguiding occurs. Large microlens array, compared to the size of the light emitting area, extract more light and result in over 100% enhancement. Such a microlens array is not limited to (O)LEDs of specific emission, configuration, pixel size, or pixel shape. It is suitable for all colors, including white, for microcavity OLEDs, and OLEDs fabricated directly on the (modified) microlens array.

33 Claims, 7 Drawing Sheets

(56) References Cited

U.S. PATENT DOCUMENTS

| | | | |
|---|---|---|---|
| 6,583,350 B1 | 6/2003 | Gee et al. | |
| 6,586,775 B2 | 7/2003 | Hirayama | |
| 6,589,334 B2 | 7/2003 | John et al. | |
| 6,611,085 B1 | 8/2003 | Gee et al. | |
| 6,640,034 B1 | 10/2003 | Charlton et al. | |
| 6,677,175 B2 | 1/2004 | Zhao et al. | |
| 6,768,256 B1 | 7/2004 | Fleming et al. | |
| 6,852,203 B1 | 2/2005 | Kawakami et al. | |
| 6,858,079 B2 | 2/2005 | Norris et al. | |
| 6,869,330 B2 | 3/2005 | Gee et al. | |
| 6,898,362 B2 | 5/2005 | Forbes et al. | |
| 6,940,174 B2 | 9/2005 | Lin et al. | |
| 6,977,768 B2 | 12/2005 | Yamaguchi | |
| 6,979,105 B2 | 12/2005 | Leysath | |
| 7,078,697 B2 | 7/2006 | Barker et al. | |
| 7,085,038 B1 | 8/2006 | Etheridge, III et al. | |
| 7,141,617 B2 | 11/2006 | Gratson et al. | |
| 7,423,306 B2 * | 9/2008 | Liu et al. | 257/292 |
| 7,509,012 B2 | 3/2009 | Zoorob et al. | |
| 7,532,792 B2 | 5/2009 | Skovgaard et al. | |
| 7,532,798 B2 | 5/2009 | Williams et al. | |
| 7,579,625 B2 * | 8/2009 | Kim | 257/72 |
| 7,726,865 B2 * | 6/2010 | Sato et al. | 362/620 |
| 7,777,416 B2 * | 8/2010 | Chari et al. | 313/512 |
| 7,952,096 B2 * | 5/2011 | Rhodes | 257/59 |
| 8,040,058 B2 * | 10/2011 | Douglas et al. | 313/506 |
| 8,076,742 B2 * | 12/2011 | Lee | 257/432 |
| 8,299,472 B2 * | 10/2012 | Yu et al. | 257/72 |
| 2002/0085187 A1 * | 7/2002 | Ohkubo | 355/41 |
| 2003/0008244 A1 | 1/2003 | Khanarian et al. | |
| 2003/0201429 A1 | 10/2003 | He et al. | |
| 2004/0036814 A1 | 2/2004 | Yamaguchi | |
| 2005/0067944 A1 * | 3/2005 | Masuda et al. | 313/501 |
| 2005/0160964 A1 | 7/2005 | Champion et al. | |
| 2005/0166837 A1 | 8/2005 | Marshall | |
| 2006/0071585 A1 | 4/2006 | Wang | |
| 2006/0132014 A1 | 6/2006 | Horiuchi et al. | |
| 2006/0170334 A1 | 8/2006 | Etheridge, III et al. | |
| 2008/0310186 A1 * | 12/2008 | Chari et al. | 362/608 |
| 2011/0163340 A1 * | 7/2011 | Smith | 257/98 |
| 2013/0108777 A1 * | 5/2013 | Koo et al. | 427/66 |

OTHER PUBLICATIONS

Lianbin Xu et al; Synthesis and Magnetic Behavior of Periodic Nickel Sphere Arrays; Paper; Sep. 16, 2003; pp. 1562-1564; Adv. Mater. 2003, 15, No. 18; Advanced Materials.

Jeffrey S. King et al; $TiO_2$ Inverse Opals Fabricated Using Low-Temperature Atomic Layer Deposition; Paper; Apr. 18, 2005; pp. 1010-1013; Adv. Mater. 2005, 17, No. 8; Advanced Materials.

Shawn-Yu Lin et al; Experimental observation of photonic-crystal emission near a photonic band edge; Paper; Jul. 28, 2003; pp. 593-595; Applied Physics Letters, vol. 83, No. 4.

J. S. King et al; High-filling-fraction inverted ZnS opals fabricated by atomic layer deposition; Paper; Sep. 29, 2003; pp. 2566-2568; Applied Physics Letters, vol. 83, No. 13.

Jean-Michel; Lourtioz et al; Microcavities and Photonic Crystals; Metallic photonic crystals; Article; 2002; pp. 79-88; C. R. Physique 3 (2002).

Lianbin Xu et al; Electrodeposited nickel and gold nanoscale metal meshes with potentially interesting photonic properties; Article; 2000; pp. 997-998; Chem. Commun., 2000.

Irina Puscasu et al. Extraordinary emission from two-dimensional plasmonicphotonic crystals; Article; 2005; pp. 1-6; Journal of Applied Physics 98, 013531 (2005).

Beatriz H. Juarez et al; Formation of Zinc Inverted Opals on Indium Tin Oxide and Silicon Substrates by Electrochemical Deposition; Article; 2004; pp. 16708-16712; J. Phys. Chem. B 2004, vol. 108, No. 43.

Timothy D. Drysdale et al.; Metallic tunable photonic crystal filter for terahertz frequencies; Article; Nov./Dec. 2003; pp. 2878-2882; J. Vac. Sci. Technol. B, vol. 21, No. 6.

C. Cuisin et al.; Fabrication of three-dimensional photonic structures with submicrometer resolution by x-ray lithography; Article; Nov./Dec. 2000; pp. 3505-3509; J. Vac. Sci. Technol. B, vol. 18, No. 6.

F. Romanato et al; Fabrication of 3D metallic photonic crystals by X-ray lithography; Paper; 2003; pp. 479-486; Microelectronic Engineering 67-68 (2003).

J. G. Fleming et al; All-metallic three-dimensional photonic crystals with a large infrared bandgap; Article; May 2, 2002; pp. 52-55; Nature, vol. 417.

Ivan Celanovic et al; Resonant-cavity enhanced thermal emission; Article; 2005; pp. 1-6; Physical Review B 72, 075127 (2005).

M. Laroche et al; Coherent Thermal Antenna Using a Photonic Crystal Slab; Article; week ending Mar. 31, 2006; pp. 1-4; Physical Review Letters 96, 123903 (2006).

Anvar A. Zakhidov et al; Carbon Structures with Three-Dimensional Periodicity at Optical Wavelengths; Article; Oct. 30, 1998; pp. 897-901; Research Articles; Science, vol. 282.

Jae-Hwang Lee et al., Two-Polymer Microtransfer Molding for Highly Layered Microstructures, Paper, 2005, pp. 2481-2485, Adv. Mater. 2005, 17, DOI:10.1002/adma.200500721, Advanced Materials, Wiley-VCH Verlag GmbH & Co. KgaA, Weinheim.

Jae-Hwang Lee et al., Woodpile Metallic Photonic Crystals Fabricated by Using Soft Lithography for Tailored Thermal Emission, Paper, 2007, pp. 791-794, Adv. Mater. 2007, 19, DOI:10.1002/adma.200602550, Advanced Materials, Wiley-VCH Verlag GmbH & Co. KgaA, Weinheim.

R.S. Bergman et al., Applications of thin film reflecting coating technology to tungsten filament lamps, Report, Nov. 1993, pp. 418-428, IEE Proceedings-A, vol. 140, No. 6.

Alfred Thelen, Design of a hot mirror: contest results, Paper, Sep. 1, 1996, pp. 4966-4977; Applied Optics / vol. 35, No. 25.

Zhi-Yuan Li et al., Photonic band structures solved by a plane-wave-based transfer matrix method, Paper, 2003, 67 046607-1-046607-11; Physical Review E 67, 046607 (2003), The American Physical Society.

R. E. Slusher; Optical Microcavities in Condensed Matter Systems; Paper, 1994; Solid State Communications, vol. 92, Nos. 1-2, pp. 149-158, 1994; Elsevier Science Ltd.

Yiru Sun et al.; Enhanced light out-coupling of organic light-emitting devices using embedded low-index grids; Paper; Aug. 2008; pp. 483-487; nature photonics, vol. 2.

Tesuo Tustsui; Doubling Coupling-Out Efficiency in Organic Light-Emitting Devices Using a Thin Silica Arogel Layer; Paper; 2001; pp. 1149-1152; Advaned Materials, 2001, 13, No. 15, Aug. 3.

Jae-Hwang Lee et al.; Diffracted moire' fringes as analysis and alignment tools for multilayer fabrication in soft lithography; Paper; 2005; pp. 86, 204101-1-3; Applied Physics Letters 86.

X. Wei et al.; Ceramic-Metal Interpenetrating Network Composites Formed by Electrodeposition; Paper; 2005; 7 pages; Journal of Electrochemical Society, 152 C513-C519.

Andreas Stein et al.; Colloidal crystal templating of three-dimensionally ordered macroporous solids: materials for photonics and beyond; 2001; 12 pages; Current Opinion in Solid State and Materials Science 5 (2001) 553-564.

K K Mendu et al.; Fabrication of multi-layered inverse opals using laser-assisted imprinting; Paper; 2005; pp. 1965-1968; Institute of Physics Publishing; Nanotechnology 16 (2005) 1965-1968.

Braun et al.; Elcetrochemical Fabrication of 3D Microperiodic Porous Materials; Paper; 2001; pp. 482-485; Adv. Mater. 2001, 13, No. 7, Apr. 4.

Joseph Shinar et al.; Organic light-emitting devices (OLEDs) and OLED-based chemical and biological sensors: an overview; Paper; 2008; pp. 1-26; Journal of Physics D: Applied Physics 41 (2008) 133001.

Kanchan Saxena et al.; A review on the light extraction techniques in organics electroluminescent devices; Paper; 2009; pp. 221-233; Optical Materials 32 (2009) 221-233.

H.J. Peng et al.; 11.4 Coupling Efficiency Enhancement of Organic Light Emitting Devices with Refractive Microlens Array on High Index Glass Substrate; Paper; 2004; pp. 158-161; SID 04 Digest.

(56) References Cited

OTHER PUBLICATIONS

Huajen Peng et al.; Coupling Efficiency Enhancement in Organic Ligh-Emitting Devices Using Microlens Array—Theory and Experiment; Paper; 2005; pp. 278-282; Journal of Display Technology, vol. 1, No. 2, Dec. 2005.

Koichi Okamoto et al.; Surface-plasmon-enhanced light emitters based on InGaN quantum wells; Paper; 2004; pp. 601-605; nature materials, vol. 3, Sep. 2004.

C. F. Madigan et al.; Improvement of output coupling efficiency of organic light-emitting diodes by backside substrate modification; Paper; 2000; pp. 1650-1652; Applied Physics Letter, vol. 76, No. 13, Mar. 27, 2000.

Hoang-Yan Lin et al.; Patterned microlens array for efficiency improvement of small-pixelated organic light emitting devices; Paper; 2008; pp. 11044-11051; Jul. 21, 2008/vol. 16, No. 15/Optics Express.

Masahiro Imada et al.; Coherent two-dimensional lasing action in surface-emitting lase with triangular photonic crystal structure; Paper; 1999; pp. 316-318; Applied Physics Letters, vol. 75, No. 3, Jul. 19, 1999.

Neil C. Greenham et al.; Angular Dependence of the Emission from a Conjugated Polymer Light-Emitting Diode: Implications for Efficiency Calculations; Paper; 1994; pp. 491-494; Advanced Materials 1994, 6, No. 6.

Shanhui Fan et al.; High Extraction of Spontaneous Emission from Slabs of Photonic Crystals; Paper; 1997; pp. 3294-3297; Physical Review Letters vol. 78, No. 17 Apr. 28, 1997.

J-Q. Xi et al.; Optical thin-film materials with low refractive index for broadband elimination of Fresnel reflection; Paper; 2007; pp. 176-179; nature photonics, vol. 1, Mar. 2007.

\* cited by examiner

SOFT LITHOGRAPHY MICROLENS FABRICATION AND ARRAY FOR ENHANCED LIGHT EXTRACTION FROM ORGANIC LIGHT EMITTING DIODES (OLEDS)

STATEMENT REGARDING FEDERALLY SPONSORED RESEARCH AND DEVELOPMENT

This invention was made in part with Government support under Grant Number DE-AC02-07CH11358 awarded by the Department of Energy. The Government has certain rights in this invention.

CROSS-REFERENCE TO RELATED PATENT APPLICATIONS

This patent application claims the benefit of U.S. Provisional Patent Application No. 61/443,465, filed Feb. 16, 2011, the entire teachings and disclosure of which are incorporated herein by reference thereto.

FIELD OF THE INVENTION

This invention generally relates to methods and apparatuses to increase the extraction efficiency of flat organic light emitting diodes (OLEDs), i.e., small molecular OLEDs (SMOLEDs) and/or polymer LEDs (PLEDs), and more particularly to the design and manufacture of microlens arrays for use therewith.

BACKGROUND OF THE INVENTION

The demand for organic and inorganic light emitting devices (LEDs) in lighting and displays is growing. Their overall external quantum efficiency is the product of the internal quantum efficiency and extraction efficiency. The internal quantum efficiency is the number of photons generated per injected electron. The extraction efficiency is the fraction of the generated photons that exits the (O)LED through its front (viewing) face.

Typical OLEDs are made on a transparent substrate, typically glass or plastic, through which the light is emitted. The light generated inside the OLED toward the front (viewing) face of the device is therefore emitted through the organic layers, the transparent indium tin oxide (ITO) anode, and the glass or plastic substrate.

However, there are innate limitations to the light extraction from the OLEDs due to the interface between the organic and indium tin oxide (ITO) anode layers and the glass substrate, and between the glass substrate and air. This results in part of the generated light being reflected back and trapped inside these layers by total internal reflection (TIR). Specifically, the index of refraction of the organic layers ($1.7 \leq n_{org}$) and of the ITO ($n_{ITO} \leq 2.0$) is larger than that of the glass or plastic substrate ($n_{glass} \sim n_{plastic} \sim 1.5$). Also, the index of refraction of the glass or plastic substrate is higher than that of air ($n_{air} = 1.03$). This results in significant fractions of the emitted light being totally internally reflected back to the organic and ITO layers, and back to the glass substrate, respectively. Almost all of the light trapped in the organic and ITO layers is reabsorbed and consequently lost. Most of the light trapped in the glass or plastic layer is waveguided to the edge of the OLED (glass mode) resulting in edge emissions through the glass. In both cases, the reflected light does not exit through the front of the device. This limits the OLED luminous and power efficiencies.

Indeed, it has been reported that the extraction efficiency, defined as the fraction of the light generated in the device that exits in the front (viewing) direction, in this typical geometry is $$\eta = \int_0^{2\pi} d\varphi \int_0^{\theta_c} \sin\theta\, d\theta \Big/ \int_0^{2\pi} d\varphi = [1 - \cos\theta_c] \qquad (1)$$

i.e., only ~17% for the typical indices given above; ~53% is trapped in the high-index organic and ITO layers, and ~30% is waveguided through the glass to the edges of the device as illustrated in FIG. 8. Thus a 30/17=176% enhancement is expected if the light waveguided through the glass is extracted.

There have been many attempts to increase the extraction efficiency by refractive index matching between each layer, using low n materials, and surface texturing or patterning. Among them, surface patterning with a periodic microlens array on the substrate has been developed and studied. The advantage of this method is that it does not change the original performance of the device because the microlens array pattern is fabricated on the blank side of the glass or plastic substrate. Unfortunately, the largest enhancement of the electroluminescence (EL) output compared to conventional ITO-coated glass-based OLEDs with a 7 μm diameter microlens array is only 68%. Construction of these microlens arrays is also difficult and costly.

There is a need, therefore, for a method of enhancing the EL of OLEDs using a microlens array that is economical and commercially viable. Embodiments of the present invention provide such methods and microlens arrays. These and other advantages of the invention, as well as additional inventive features, will be apparent from the description of the invention provided herein.

BRIEF SUMMARY OF THE INVENTION

In view of the above, embodiments of the present invention provide new and improved microlens array geometry and methods of manufacture therefor that enhance the electroluminescence (EL) output of OLEDs beyond that achieved to date.

More specifically, embodiments of the present invention enhance the extraction efficiency of flat OLEDs (i.e., small molecular OLEDs (SMOLEDs) and/or polymer LEDs (PLEDs)) using a novel and nonobvious microlens array geometry patterned on the front face of such devices. In accordance with the teachings of the present invention, the geometry of the microlens array provides significant advantage over prior microlens arrays. Specifically, embodiments of the array of the present invention utilize individual microlenses whose dimensions are larger than those the OLED's individual pixel. Such embodiments of the present invention provide a design of the array that enhances the outcoupled light at a level unattained so far, creating a new (micro) luminaire that is structurally integrated with the OLED pixel. Further, embodiments of the present invention provide economical, commercially viable methods of enhancing light extraction from organic light emitting diodes (OLEDs) using such a microlens array. Still further, embodiments of the present invention provide methods of manufacturing such microlens arrays.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Turning now to the drawings, embodiments of both the manufacturing methods and resulting microlens arrays and OLEDs incorporating same will be discussed. As will become apparent, embodiments of the present invention provide an easy and cost effective method of making polymer-based microlens arrays with soft lithography. Indeed, preliminary results of embodiments of OLEDs patterned with 1.5 µm diameter microlens arrays constructed in accordance with the teachings of the present invention show 100% enhancement of the electroluminescence (EL) output compared to conventional ITO-coated glass-based OLEDs. This compares to the largest enhancement reported to date discussed above, with 7 µm diameter microlens array, which is 68%.

Figure 1:
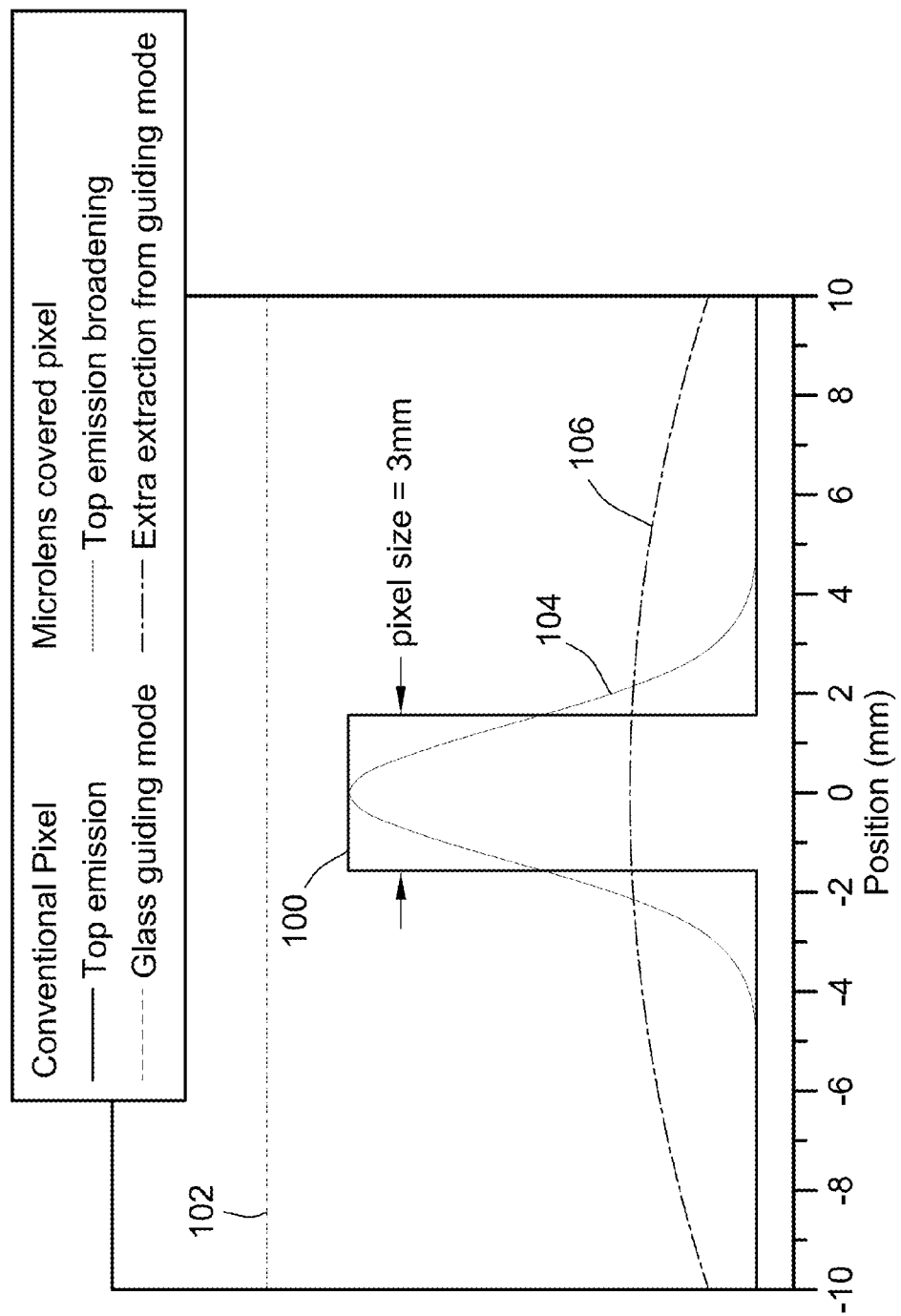
FIG. 1 is a graphical illustration of the light extraction outside of the pixel area enabled by embodiments of the present invention compared to a conventional pixel of an OLED.

In the conventional OLED geometry, once light is reflected back into a waveguided mode, it can only escape as edge emission, be absorbed by the waveguiding medium, or be scattered. The microlens array can extract light in the guiding mode in the substrate to a normal direction. This extraction mechanism extracts more light not only in the light emitting area but also outside of the light emitting area as long as there is a guided light in the substrate as shown by FIG. 1. As shown in this FIG. 1, trace 100 illustrates the top emission of a conventional OLED pixel and trace 102 the glass guiding mode. However for a microlens covered OLED pixel, trace 104 illustrates top emission broadening and trace 106 illustrates the extra extraction from the guiding mode.

As such, extraction enhancement is governed by the area of the micro lens array patterned, as well as the period and dimensions of each microlens in the array. Embodiments of the present invention have a large area of microlens array, e.g. 16×16 mm$^2$, compared to the light emitting area, e.g. OLED pixel area of 3.3×3 mm$^2$. As will be discussed more fully below, use of such large area microlens confirms that extraction is not restricted only to the pixel area of the OLED.

Figure 2:
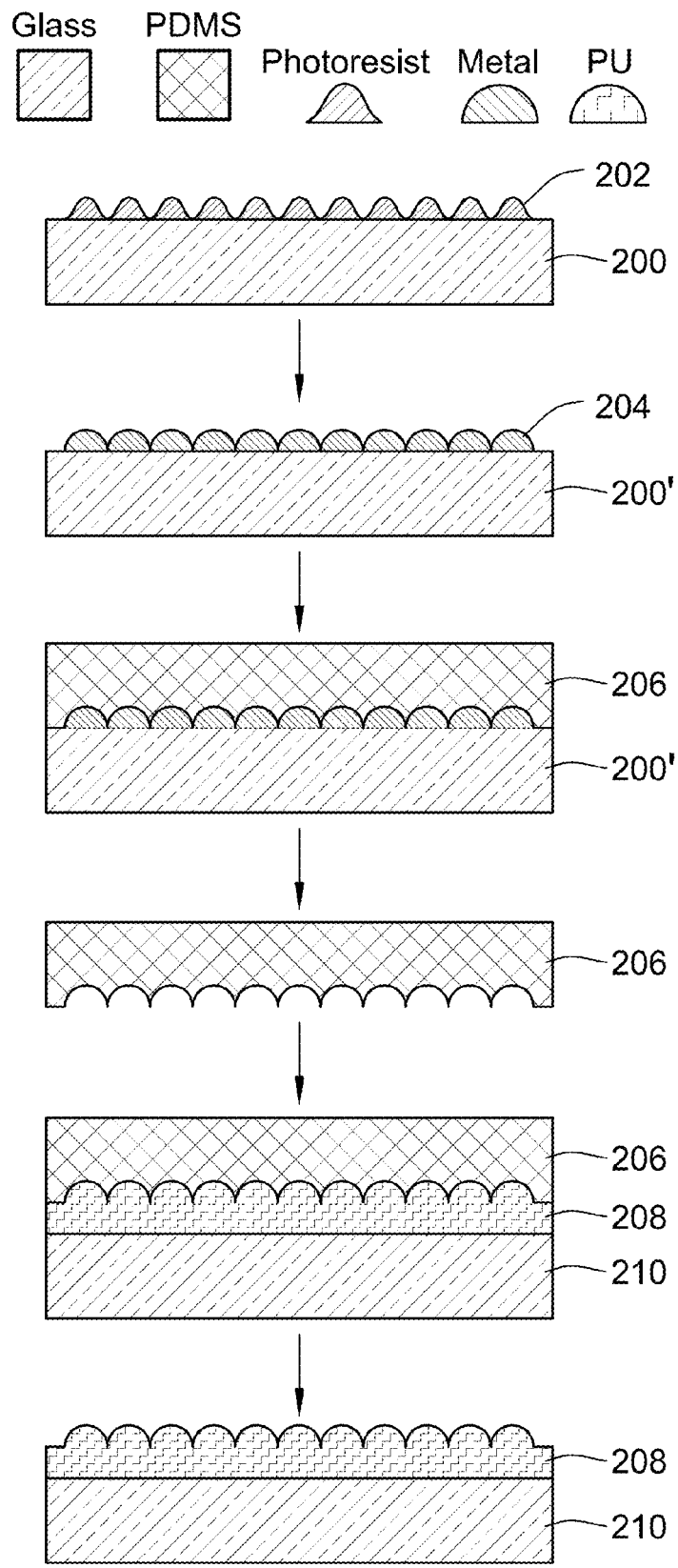
FIG. 2 is a schematic diagram of an embodiment of a polyurethane (PU) microlens fabrication process in accordance with the teachings of the present invention.

FIG. 2 shows a schematic diagram of one embodiment of the microlens fabrication process of the present invention. While preferred embodiments of this process and resulting apparatuses will utilize polyurethane (PU), those skilled in the art will recognize from the following that other optically transparent epoxies or polymers (OTE/P), e.g. SU-8, SU-8 2000, SU-8 3000 (collectively "SU-8"), Polydimethylsiloxane (PDMS), Ormocers (Hybrid Polymers from Microresist Technology, GmbH), polyacrylate (PA), NOA 61, 63 (Optical Adhesives from Norland Inc.), etc., may be used in place of PU. As such, the following description should be taken by way of example and not by way of limitation. As will also be recognized by those skilled in the art, depending on which OTE/P is utilized, the curing steps may be ultraviolet (UV) or thermally based as appropriate.

Figure 3A:
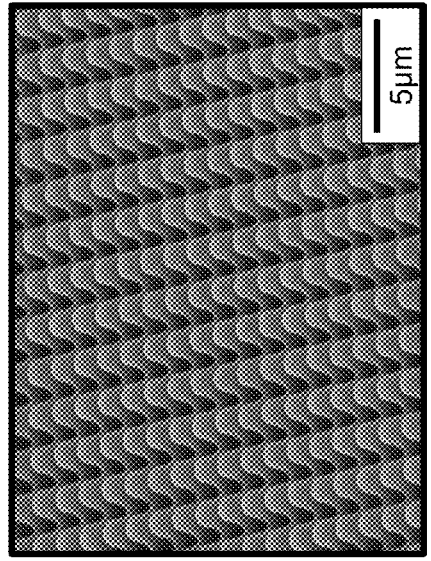
FIGS. 3A-D include scanning electron microscope (SEM) images of various stages of an embodiment of a microlens fabrication process including (A) a two dimensional pattern of photoresist obtained by double expose ultraviolet (UV) laser interference holography, (B) metal-coated pattern for making spherical lens patterns, (C) PDMS molding, and (D) stamping the pattern on the PU using the patterned PDMS.
Figure 3B:
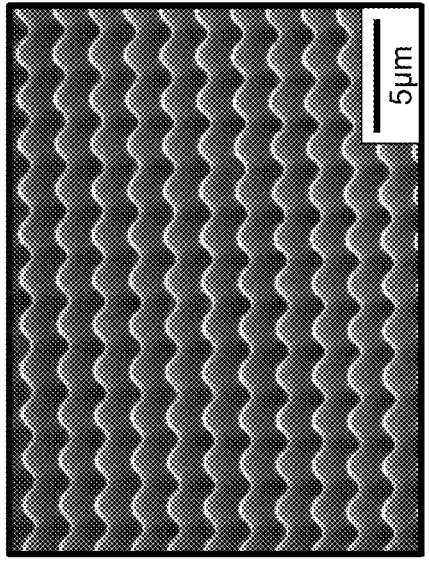
Figure 3C:
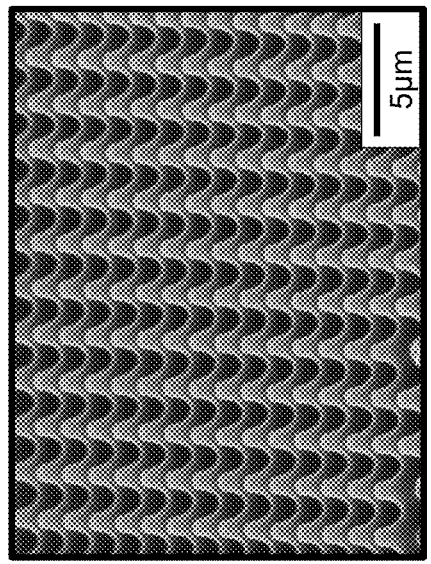
Figure 3D:
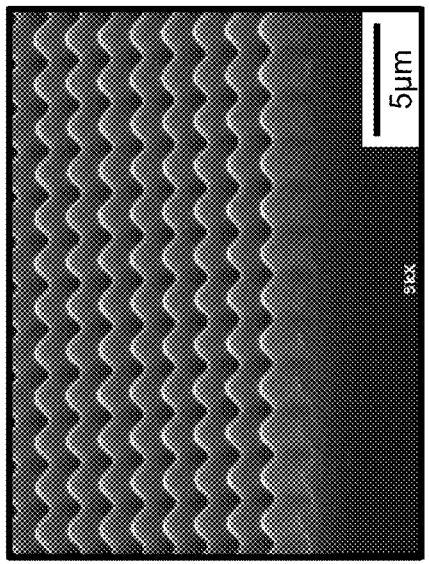

FIGS. 3A-D show scanning electron microscope (SEM) images of the patterns fabricated during the process of FIG. 2 in order to obtain the final microlens pattern. FIG. 3A shows a 2D pattern of photoresist obtained by double exposure UV laser interference holography, FIG. 3B metal-coated pattern for making spherical lens patterns, FIG. 3C PDMS molding, and FIG. 3D stamping the pattern on the PU using the patterned PDMS.

Soft lithography is used to create various structures with critical dimensions of a few microns. The advantages of the technique include ease of fabrication, large area structures, and very ordered and uniform patterns. With this method, a structure may be generated with a PDMS mold that has an identical relief pattern to that which is desired. Once the mold has been filled with a suitable material, it is simply stamped on any surface to create the pattern. Like all molds, the crucial step is to create the relief pattern that is the inverse of the structure to be generated. For feature size of a few microns, PDMS is an excellent choice because of its flexibility and non-wetting properties. Typically, PDMS is poured onto a master stamp to create the relief pattern. After the PDMS is cured and solidified, it is peeled off the master stamp and is ready to use. As long as the master stamp is not physically damaged, it can be used repeatedly for making more molds, which can also be used many times until damaged through wear.

Figure 4:
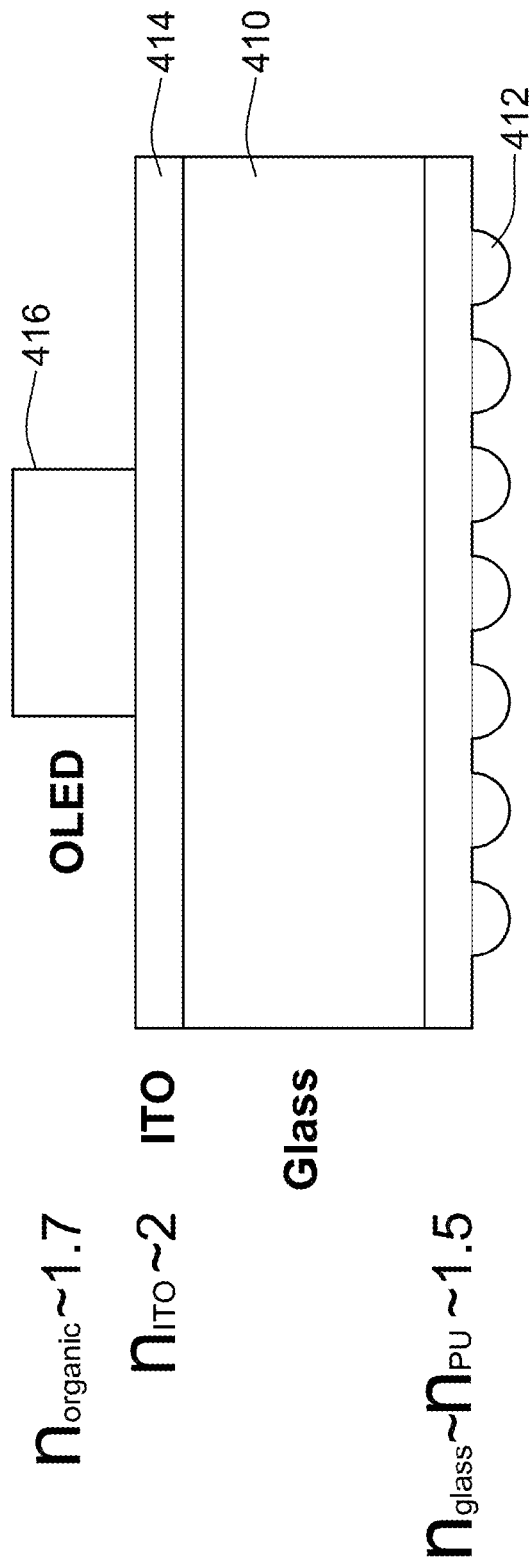
FIG. 4 is a schematic illustration of an OLED pixel with a microlens array constructed in accordance with the teachings of the present invention.

Returning to FIG. 2, the microlens arrays are fabricated on the blank glass side of the OLEDs using PU as follows: The master stamp is fabricated using two-beam laser holography on a photoresist. Since a single exposure to UV light creates a 1-D pattern, a 2-D pattern is achieved by a second exposure after rotating the sample by 90°. This results in an inverse microlens pattern of photoresist 202 on a glass substrate 200 (see image of FIG. 3A). The bottom of the structure is not quite as spherical as that for an optimal microlens but this is remedied by heating the sample to 140° C. for 60 seconds. The final step in fabricating the master stamp is the thermal deposition of a 100 nm gold film 204 on top of the photoresist 202 (see image of FIG. 3B). The gold film 204 acts as an electrode for nickel electroplating. A total thickness of 10 μm of nickel is electroplated (Caswell Plating) and the whole film of nickel is detached from the glass substrate by dissolving the photo-resist. This thin nickel sheet with the microlens features facing up is carefully glued to a glass substrate 200' for molding purpose. PDMS 206 is poured on top of the master stamp and is peeled off after curing (see image of FIG. 3C). In one approach, a tiny drop of UV curable PU 208 (Summers Optical Type J-91) is applied on the glass surface of an ITO coated glass substrate 210 (Colorado Concept Coatings) and the PDMS mold 206 is pressed against it. Any excess PU is easily removed. Following this procedure, the PU is cured in a UV chamber, the PDMS mold is lifted off, and the microlens array is formed (see image of FIG. 3D). The resulting structure may be seen in FIG. 4 illustrating the microlens array 412 on the ITO 414 coated glass substrate 410 for the OLED 416.

Figure 5:
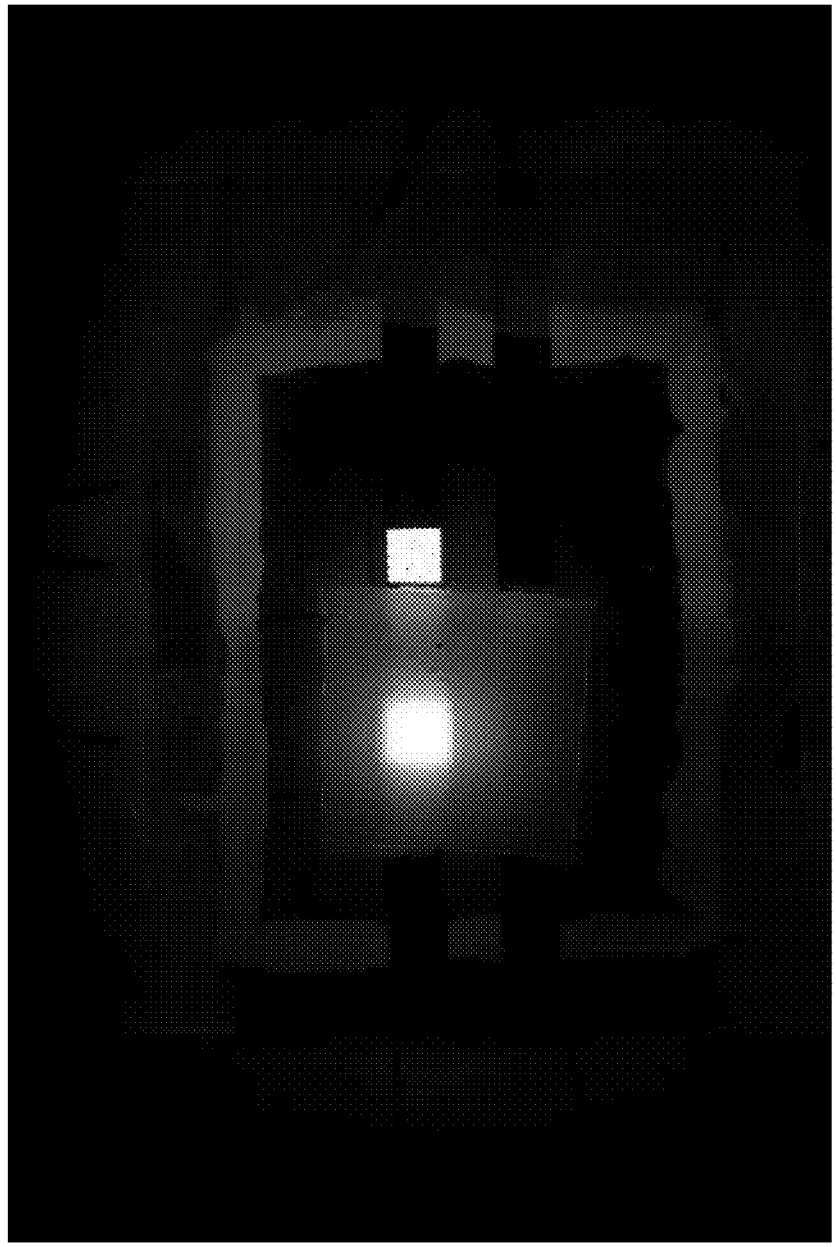
FIG. 5 is an image of two OLED pixels, one including a microlens constructed in accordance with the teachings (left) of the present invention and one without.

In one embodiment, the microlens array only covers a portion of the ITO-coated glass as shown in FIG. 5. In this FIG. 5, an image of two OLED pixels is shown. A microlens array is positioned above and around the left OLED pixel, while no microlens array is included for the right OLED pixel as oriented in FIG. 5. Note that much of the edge emission from the left pixel is absent from the left edge of its substrate because it is extracted by the microlens array.

The ITO side of the glass is patterned and etched to form the electrodes for multiple OLED pixels. Before the OLED pixel array is fabricated, the ITO glass is thoroughly cleaned with detergent and organic solvents and subsequently treated in a UV ozone oven to adjust the ITO work function and facilitate hole injection as is known. The organic layers, CsF, LiF, or other buffer layer, and Al cathode are all thermally deposited in a vacuum evaporation chamber (background pressure $<5 \times 10^{-6}$ ton) inside an Ar-filled glove box. The organic layers consist of a hole injecting layer, typically copper phthalocyanine (CuPc) or $MoO_3$, a hole transport layer (HTL), typically N,N'-diphenyl-N,N'-bis(1-naphthylphenyl)-1,1'-biphenyl-4,4'-diamine (NPD), an emitting layer of any of various materials and blends, and an electron transport layer (ETL), typically tris(8-hydroxyquinoline) $Al(Alq_3)$ or 4,7-diphenyl-1,10-phenanthroline (BPhen).

Microlens embodiments of the present invention, as examples, were used on two different emitting materials to determine effectiveness thereof. The two materials were green light-emitting $Alq_3$, and blue light-emitting 4,4'-bis(2,2'-diphenylvinyl)-1,1'-biphenyl (DPVBi). Following deposition of a 1 nm-thick LiF or CsF buffer layer, the final Al cathode layer is deposited through a shadow mask to yield several 3 mm wide stripes. As a result, there are 8 OLED devices on the ITO glass. Half of them are on the plain glass portion of the substrate and the rest are on the glass substrate covered with the microlens array. The devices are encapsulated after fabrication to protect them from exposure to water and oxygen and subsequent degradation. Wires are connected to the electrodes of each pixel and to the power source for measurements. In this way, there can be a direct comparison between the textured and plain glass substrates. Measurements are done by placing the device on the opening of an integrating sphere. The signal collected in the integrating sphere is transmitted through an optical fiber to an Ocean Optics spectrometer (Model Number S2000PCI) for analysis.

FIG. 5 shows the light intensity measurements of the emissive layer DPVBi from the micro-lenses textured area compared to the plain glass substrate. For simplicity, only two devices on a plain glass substrate and a micro-lenses substrate are shown. Because the contact resistance for each device is different, the measurement intensity is normalized with the input power. It is clear that the devices behave identically except that the light extraction is significantly higher from the side coated with the microlens array. A similar result is achieved on a Pt octaethylporphyrin (PtOEP)-based guest-host emitting layer, although the enhancement is not as large as that obtained with DPVBi.

In this FIG. 5, OLED pixels were fabricated under the same conditions with and without the microlens array. The same electric currents are applied to the two pixels. The area covered with the microlens array has more broad extracted light even outside of the pixel area compared to the conventional OLED which emits only above the (square) pixel area. The edge emission can be observed around the OLED pixel array, as it is sealed with, e.g., epoxy to avoid moisture contamination and that epoxy seal scatters some of that edge emission towards the viewer. As clearly seen, the emission from the edge of the microlens-covered left OLED pixel is much dimmer than from that of the uncovered right pixel, demonstrating that much of the waveguided light in the left pixel is extracted by the microlens array as mentioned above. Note that the emission from the microlens-covered pixel is also blurred. This might be useful in general lighting or backlighting in some electronic devices.

Figure 6:
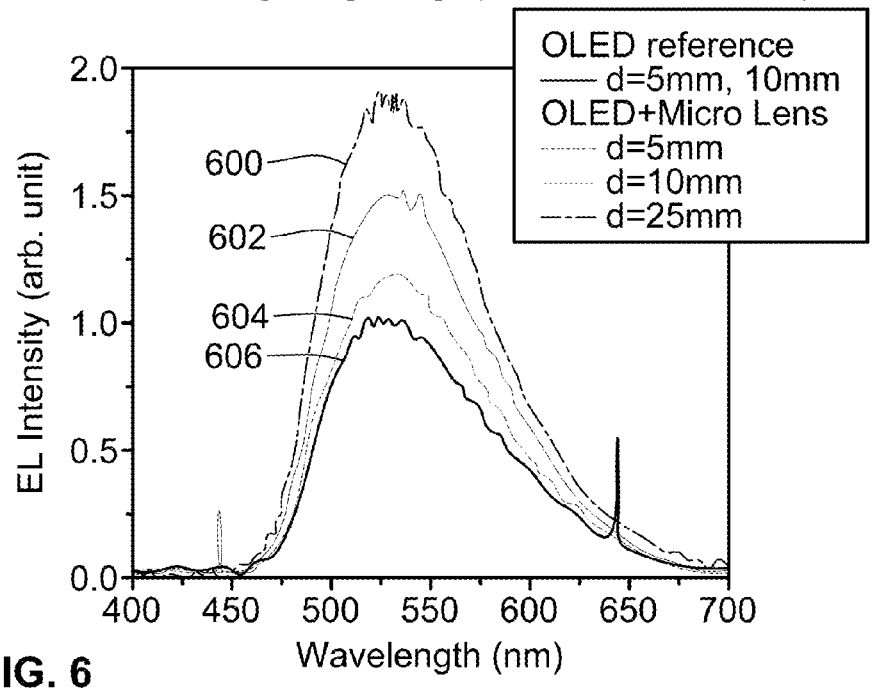
FIG. 6 is a graphic illustration of green OLED electroluminescence intensity measured with integrating sphere with variable aperture.

FIG. 6 shows the OLED intensities measured with a 3" integrating sphere, to collect all the emission from the front surface of the glass. As in FIG. 5, the reference pixel and the pixel covered by the microlens array were from the same array. Two types of OLEDs, with peak wavelength in the green and blue bands, were tested separately. The OLED pixel size was $\sim 3 \times 3$ mm$^2$ and the microlens pattern area was $\sim 15 \times 15$ mm$^2$. The green OLEDs (FIG. 6) were placed on opening ports of the integrating sphere of various sizes (trace 600 for d=25 mm, trace 602 for d=10 mm, trace 604 for d=5 mm). The reference pixel yielded same intensity regardless of the opening size, whether 5 mm or 10 mm, as shown by trace 606, whereas the microlens array-covered pixel exhibited an intensity increase of 100% with increasing collection area.

Figure 7:
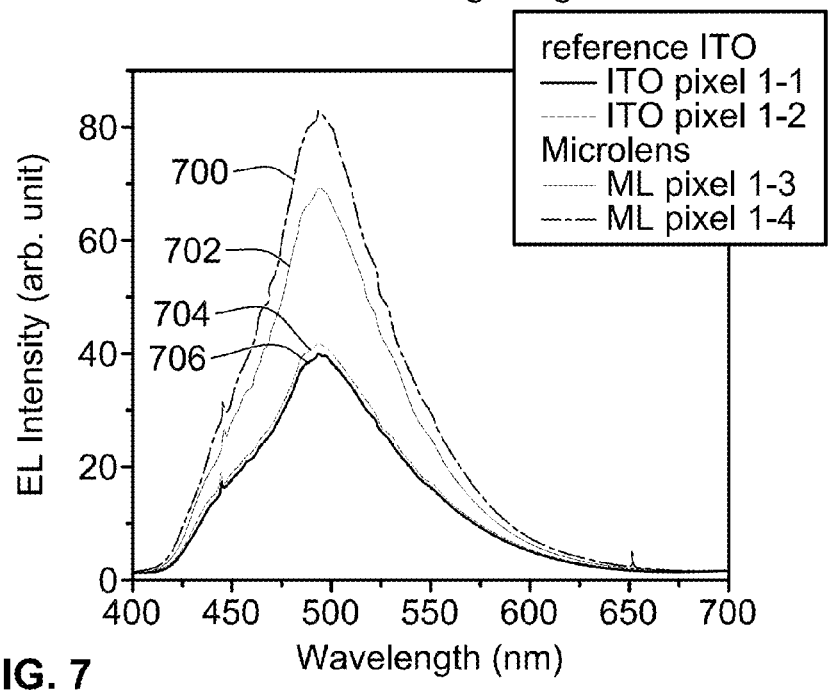
FIG. 7 is a graphic illustration of blue OLED electroluminescence intensity measured with integrating sphere.
Figure 8:
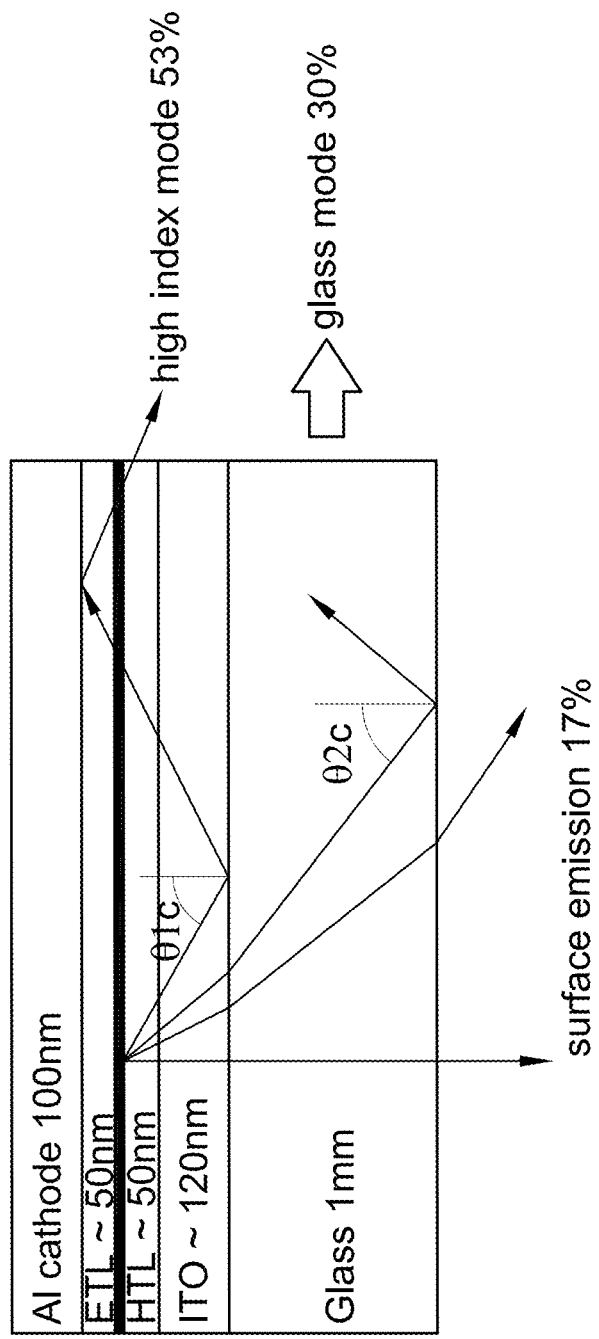
FIG. 8 is a schematic diagram of waveguided OLED emission modes resulting from total internal reflection of a typical OLED.

The spectra of the blue OLEDs (FIG. 7) were measured with a fixed opening size. Once again the micro lens array increased the intensity by about 100%. The microlens pattern was centered above one pixel ("pixel 1"), and was off center for another pixel ("pixel 2") that pixel was effectively not covered by the microlens array.

When the pixels are placed in the middle of the opening of the integrating sphere, pixel 1 is covered by a larger area of the microlens array pattern in comparison to pixel 2. The measurement using this configuration indicates that extraction of the light waveguided in the glass is proportional to the microlens pattern area. Trace 700 illustrates ML pixel 1-4, and trace 702 illustrates ML pixel 1-3, whereas trace 706 illustrates the reference ITO pixel 1-1 and trace 704 illustrates reference ITO pixel 1-2. This clearly demonstrates that the microlens array is extracting light from the substrate outside of the light emitting pixel area and a large patterned area results in more extraction as long as there is a waveguiding substrate.

Embodiments of the invention are not limited to the OLED/microlens materials and structures described above. For example, embodiments of the OLEDs can be fabricated on a plastic substrate, including directly on the (modified) PU microlens array. A mirror can also be included in an embodiment to reflect the light that propagates in a direction opposite to the display direction. In another embodiment, the substrate on which the OLED pixels are fabricated is beveled on both sides of each pixel. In addition to common glass and plastic substrates, a substrate with a high refractive index is used in an embodiment. Encapsulated OLEDs are also subject to the described outcoupling enhancement. Importantly, as shown for green and blue OLEDs, mixed colors, such as red, green, and blue are utilized on the same OLED pixel array to enhance the outcoupling of all colors, including the resulting mixed white light are also included. Microcavity OLEDs also benefit from the outcoupling enhancement, and are also included.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A light emitting device, comprising:
   a light emitting pixel having a first area;
   a transparent electrode coupled to the light emitting pixel and positioned on a first surface of a transparent substrate;
   an optically transparent epoxy/polymer (OTE/P) microlens array having a uniform pattern area larger than the first area, the optically transparent microlens array positioned on a second surface of the transparent substrate.

2. The light emitting device of claim 1, wherein the optically transparent microlens array is a polyurethane (PU) microlens array.

3. The light emitting device of claim 1, wherein the microlens array includes a plurality of microlenses each having a diameter less than 7 µm.

4. The light emitting device of claim 3, wherein the diameter is approximately 1.5 µm.

5. The light emitting device of claim 1, wherein the first area is approximately 3×3 mm$^2$ and the pattern area is at least approximately 15×15 mm$^2$.

6. The light emitting device of claim 1, wherein the light emitting pixel is an organic light emitting diode (OLED).

7. The light emitting device of claim 1, wherein the light emitting pixel is a small molecular organic light emitting diode (SMOLED).

8. The light emitting device of claim 1, wherein the light emitting pixel is a polymer light emitting diode (PLED).

9. The light emitting device of claim 1, wherein the transparent substrate is glass.

10. The light emitting device of claim 1, wherein the transparent substrate is plastic.

11. The light emitting device of claim 1, wherein the transparent substrate is beveled on both sides of the light emitting pixel.

12. The light emitting device of claim 1, further comprising a mirror positioned to reflect light from the light emitting pixel that propagates in a direction away from the microlens array.

13. The light emitting device of claim 1, wherein the optically transparent microlens array is one of an SU-8 microlens array, a polydimethylsiloxane (PDMS) microlens array, an Ormocers microlens array, an polyacrylate (PA) microlens array, an NOA 61 microlens array, or an NOA 63 microlens array.

14. A method of manufacturing a light emitting device having a light emitting pixel having a first area attached to a transparent substrate, comprising the steps of:
   applying curable optically transparent epoxy/polymer (OTE/P) on a front viewing face of the transparent substrate of the light emitting device;
   pressing a PDMS mold having a relief pattern of a microlens array having an area greater than the first area against the curable OTE/P;
   curing the curable OTE/P;
   removing the PDMS mold to form the microlens array on the front viewing face.

15. The method of claim 14, wherein the steps of applying, pressing, and curing, comprise the steps of:
   applying one of UV curable polyurethane (PU), polyacrylate (PA), NOA 61, or NOA 63 on the front viewing face of the transparent substrate of the light emitting device;
   pressing the PDMS mold against the UV curable PU, PA, NOA 61, or NOA 63; and
   curing the UV curable PU, PA, NOA 61, or NOA 63.

16. The method of claim 15, wherein the step of applying comprises the step of applying a drop of UV curable polyurethane (PU) on a front viewing face of an indium tin oxide (ITO) coated glass substrate of the light emitting device.

17. The method of claim 14, wherein the step of pressing comprising the step of pressing a PDMS mold having a relief pattern of a microlens array including a plurality of OTE/P microlenses each having a diameter less than 7 µm.

18. The method of claim 14, wherein the step of pressing comprising the step of pressing a PDMS mold having a relief pattern of a microlens array including a plurality of PU microlenses each having a diameter of approximately 1.5 µm.

19. The method of claim 14, further comprising the step of attaching a mirror to the transparent substrate such that light from the light emitting pixel that propagates away from the front viewing face is reflected.

20. The method of claim 14, further comprising the step of manufacturing the PDMS mold prior to the step of pressing.

21. The method of claim 20, wherein the step of manufacturing the PDMS mold comprises the steps of:
- fabricating a master stamp inverse microlens pattern on a glass substrate;
- thermal depositing a gold film on top of the master stamp inverse microlens pattern;
- electroplating nickel on the gold film to form a patterned nickel sheet;
- detaching the patterned nickel sheet from the glass substrate;
- attaching the patterned nickel sheet to a glass substrate for molding purpose;
- pouring PDMS on top of the patterned nickel sheet;
- curing the PDMS; and
- peeling off the PDMS for use as the PDMS mold.

22. The method of claim 21, wherein the step of fabricating comprises the steps of using two-beam laser holography on a photoresist by providing a single exposure to UV light to create a 1-D pattern, rotating the photoresist by 90°, providing a second exposure to UV light to create a 2-D pattern.

23. The method of claim 22, wherein the step of detaching comprises the step of detaching the patterned nickel sheet from the glass substrate by dissolving the photoresist.

24. The method of claim 21, further comprising the step of heating the master stamp inverse microlens pattern to approximately 140° C. for approximately 60 seconds.

25. The method of claim 21, wherein the step of thermal depositing a gold film comprises the step of thermal depositing a 100 nm gold film, and wherein the step of electroplating comprises the step of 10 μm of nickel on the gold film.

26. The method of claim 14, wherein the steps of applying, pressing, and curing, comprise the steps of:
- applying one of thermally curable SU-8, PDMS, or Ormocers on the front viewing face of the transparent substrate of the light emitting device;
- pressing the PDMS mold against the thermally curable SU-8, PDMS, or Ormocers; and
- curing the thermally curable SU-8, PDMS, or Ormocers.

27. A method of increasing the extraction efficiency of an organic light emitting diode having a light emitting pixel and a transparent electrode coupled to the light emitting pixel and positioned on a first surface of a transparent substrate, comprising the steps of:
- positioning an optically transparent epoxy/polymer (OTE/P) microlens array including a plurality of uniformly patterned OTE/P microlenses each having a diameter of approximately 1.5 μm on a second surface of the transparent substrate.

28. The method of claim 27, wherein the light emitting pixel has a first area, and wherein the step of positioning comprises the step of positioning a OTE/P microlens array having a pattern area larger than the first area on the second surface of the transparent substrate.

29. The method of claim 27, wherein the step of positioning comprises the step of positioning a polyurethane (PU) microlens array including a plurality of PU microlenses each having a diameter of approximately 1.5 μm on the second surface of the transparent substrate.

30. The method of claim 27, wherein the step of positioning comprises the step of positioning an SU-8 microlens array including a plurality of uniformly patterned SU-8 microlenses each having a diameter of approximately 1.5 μm on the second surface of the transparent substrate.

31. The light emitting device of claim 1, wherein the optically transparent epoxy/polymer (OTE/P) is either UV curable or thermally curable.

32. The light emitting device of claim 1, wherein the optically transparent epoxy/polymer (OTE/P) microlens array is fabricated using a PDMS mold having a relief pattern for a microlens array formed therein.

33. The light emitting device of claim 1, manufactured using the method of claim 14.

* * * * *